(12) United States Patent
Park et al.

(10) Patent No.: US 7,772,069 B2
(45) Date of Patent: Aug. 10, 2010

(54) METHODS OF FORMING A SEMICONDUCTOR DEVICE

(75) Inventors: Sang-Yong Park, Suwon-si (KR);
Sung-Hyun Kwon, Seoul (KR);
Jae-Hwang Sim, Seoul (KR); Keon-Soo Kim, Gyeonggi-do (KR); Jae-Kwan Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 12/074,992

(22) Filed: Mar. 7, 2008

(65) Prior Publication Data
US 2008/0227258 A1 Sep. 18, 2008

(30) Foreign Application Priority Data
Mar. 12, 2007 (KR) .................... 10-2007-0024097

(51) Int. Cl.
*H01L 21/336* (2006.01)
(52) U.S. Cl. .............. 438/266; 438/257; 438/759; 438/424; 438/437; 438/638; 430/313; 257/E21.023; 257/E21.546; 257/E21.548; 257/E21.64

(58) Field of Classification Search ............... 438/257, 438/424, 435–437, 638, 639; 257/E21.546, 257/548, 626; 430/313
See application file for complete search history.

(56) References Cited

U.S. PATENT DOCUMENTS

| 6,818,480 B2 * | 11/2004 | Lee et al. .................. 438/128 |
| 2003/0127682 A1 | 7/2003 | Lee et al. .................. 257/315 |
| 2004/0099925 A1 * | 5/2004 | Poveda .................. 257/622 |
| 2006/0234166 A1 * | 10/2006 | Lee et al. .................. 430/313 |

FOREIGN PATENT DOCUMENTS

| JP | 2000164734 | 6/2000 |
| KR | 1020020059934 | 7/2002 |

* cited by examiner

*Primary Examiner*—Charles D Garber
*Assistant Examiner*—Yasser A Abdelaziez
(74) *Attorney, Agent, or Firm*—Myers Bigel Sibley & Sajovec, P.A.

(57) ABSTRACT

A method of forming a semiconductor device is provided. A plurality of first guide patterns are formed on a substrate. A mask layer is conformally formed on the substrate. Second guide patterns are formed in empty regions on respective sides of the first guide patterns. The mask layer is planarized and the first and second guide patterns are removed. The mask layer is etched by an anisotropic etching process.

22 Claims, 11 Drawing Sheets

METHODS OF FORMING A SEMICONDUCTOR DEVICE

CROSS-REFERENCE TO RELATED APPLICATIONS

This application is related to and claims priority under 35 U.S.C. §119 of Korean Patent Application No. 2007-24097, filed on Mar. 12, 2007, the entire contents of which are hereby incorporated by reference.

BACKGROUND OF THE INVENTION

The present invention relates to methods of forming a semiconductor device, and more particularly, to methods of forming a semiconductor device including a fine pattern.

A semiconductor (integrated circuit) device generally includes a variety of types of patterns that are disposed on a semiconductor substrate and are electrically connected to each other to operate in a desired manner. Conventionally, the semiconductor patterns are generally defined using an exposure process. In such a process, a photoresist pattern is generally formed including openings at locations selected so that the exposure process defines the semiconductor pattern as a layer on the semiconductor substrate.

In a high integration semiconductor device, a line width (spacing between feature lines) that the exposure process may define has a limit. Particularly, a number of problems due to the exposure process may occur in light of semiconductor industry standards that requires a minimum line width of several tens of a nanometer. For instance, when a semiconductor pattern is defined using the exposure process, a uniformity of a line width of the semiconductor pattern may be degraded by a wafer region, a uniformity of exposure light and/or a uniformity of a lower portion layer. That is, a distribution of a line width of the semiconductor pattern may increase. As the integration density of semiconductor devices increase, a uniformity of a line width of the semiconductor pattern may be more severely degraded. Characteristics of the unit devices formed by the semiconductor pattern may become different (vary) due to the variation of the line width, which may cause a malfunction of the semiconductor device. For example, the variation of the line width may have a serious effect on a high integration memory device, where the same patterns are repeatedly arranged.

It may be more difficult to define a space between patterns having a fine line width than a pattern having a fine line width using the exposure process. To address this problem, a double exposure process has been introduced. In the typical double exposure process, first mask patterns of a large space are formed by a first exposure process and second mask patterns of a large space are formed between the first mask patterns by a second exposure process. However, the double exposure process may have a problem of a misalignment between the first and second mask patterns.

SUMMARY OF THE INVENTION

In some embodiments, methods of forming a semiconductor device include forming a mask layer on a semiconductor substrate. The mask layer has vertically and horizontally extending portions. The vertically extending portions have a thickness selected to provide a desired line width to an underlying structure to be formed using the mask layer and a height greater than a height of the horizontally extending portions. The underlying structure is formed using the mask layer.

In other embodiments, the underlying structure is mask patterns. The semiconductor device may be a memory device and forming the underlying structure further includes forming word lines using the mask patterns. Forming the mask patterns may include concurrently forming a string selection mask pattern, a ground selection mask pattern and a plurality of cell mask patterns extending between the string selection mask pattern and the ground selection mask pattern. The string selection mask pattern and the ground selection mask pattern may have a line width greater than a line width of the cell mask patterns. Forming the word lines may include forming the word lines using the cell mask patterns and forming the underlying structure may further include forming a string selection line using the string selection mask pattern and forming a ground selection line using the ground selection mask pattern.

In further embodiments, methods of forming a semiconductor device include forming a plurality of first guide patterns on an etching target layer of a substrate and conformally forming a mask layer on the substrate in a region including the first guide patterns to define empty regions on respective sides of the first guide patterns. Second guide patterns are formed in the empty regions. The mask layer is planarized down to expose the first guide pattern and to define a preliminary mask pattern including wall portions between the first and second guide patterns and a base portion under the second guide pattern. The first and second guide patterns are removed and the base portion is removed by anisotropic etching of the mask layer to form mask patterns.

In other embodiments, removing the first and second guide patterns is preceded by removing a guide pattern selected from the first and second guide patterns to form a gap region and forming a filling mask pattern that fills the gap region. The filling mask pattern is formed of a material having an etching selectivity with respect to the first and second guide patterns. The mask patterns may include a first mask pattern and a second mask pattern displaced therefrom, the first mask pattern being the anisotropically etched wall portion and the second mask pattern including the filling mask pattern and a pair of the anisotropically etched wall portions in contact with both sidewalls of the filling mask pattern. The filling mask pattern and the mask layer may be formed of a same material. The first guide patterns may be formed to be parallel to each other.

In further embodiments, the methods further include etching the etching target layer to form actual patterns using the mask patterns as an etching mask. The etching target layer may be formed of a conductive material. The etching target layer may be a hard mask layer and the actual patterns correspond to hard mask patterns and the methods may further include etching the substrate using the hard mask pattern as an etching mask to form a trench defining an active region. The first and second guide patterns may be formed of a same material.

In yet other embodiments, methods of forming a semiconductor device include forming first guide patterns on a control gate conductive layer of a substrate. The first guide patterns extend parallel to each other. The first guide patterns include a string selection guide pattern, a ground selection guide pattern, and a plurality of cell guide patterns between the string and ground selection guide patterns. A mask layer is conformally formed on the substrate in a region including the first guide patterns to define empty regions on respective sides of the first guide patterns. Second guide patterns are formed in the empty regions. The mask layer is planarized down to a top surface of the first guide pattern to form preliminary mask patterns. Each of the preliminary mask patterns includes a wall portion between the first and second guide patterns and a base portion under the second guide pattern. The string and ground selection guide patterns are removed to form respective first and second gap regions. First and second filling mask patterns are formed that fill the respective first and second gap regions. The first and second guide patterns are removed and the base portion is removed by anisotropic etching to form mask patterns. The mask layer and the first and second filling mask patterns are formed of a material having an etching selectivity with respect to the first and second guide patterns.

In other embodiments, the mask pattern includes a string selection mask pattern, cell mask patterns and a ground selection mask pattern. The string selection mask pattern includes the first filling mask pattern and the anisotropically etched wall portions in contact with both sides of the first filling mask pattern. The ground selection mask pattern includes the second filling mask pattern and the anisotropically etched wall portions in contact with both sides of the second filling mask pattern. The cell mask patterns include the anisotropically etched wall portions between the string selection mask pattern and the ground selection mask pattern.

In further embodiments, removing the base portion is followed by etching the control gate conductive layer to form a string selection line, word lines and a ground selection line using the mask patterns as an etching mask. Etching the control gate conductive layer may be followed by implanting dopant ions into the substrate using the string selection line, word lines and the ground selection line as a mask to form a common source region, cell source/drain regions and a common drain region.

In other embodiments, forming first guide patterns is preceded by forming a tunnel insulating layer on the substrate, forming a charge storage layer on the tunnel insulating layer and forming a blocking insulating layer on the charge storing layer. The control gate conductive layer is formed on the blocking insulating layer. The charge storage layer may be formed of an insulating material including deep level traps and the string selection line, the word lines and the ground selection line may be formed by etching the control gate conductive layer using the mask patterns as an etching mask. The charge storage layer may be formed of polysilicon and the string selection line, the word lines and the ground selection line may be formed by successively etching the control gate conductive layer, the blocking insulating layer and the charge storage layer using the mask patterns as an etching mask. One of the word lines closest to the string selection line and one of the word lines closest to the ground selection line may be dummy lines that are not coupled to active cells.

In further embodiments, the mask layer, the first filling mask pattern and second filling mask pattern are formed of a same material. The first and second guide patterns may be formed of a same material. The wall portions between the string selection guide and the ground selection pattern may be an even number of wall portions.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EMBODIMENTS

Figure 1A:
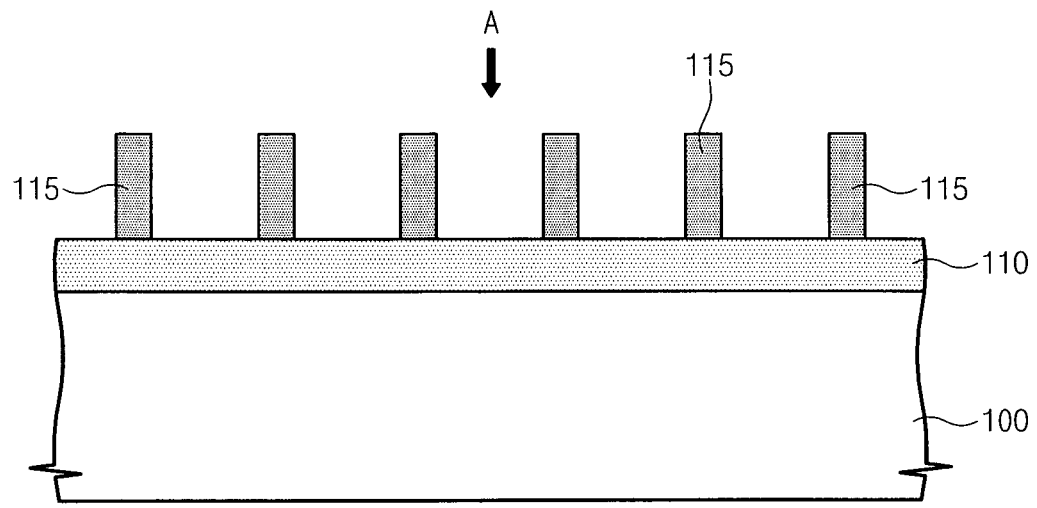
FIGS. 1A through 1J are cross sectional views illustrating a method of forming a semiconductor device in accordance with some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention will now be further described with reference to the figures. FIGS. 1A through 1J are cross sectional views illustrating a method of forming a semiconductor device in accordance with some embodiments of the present invention and FIG. 2 is a top plan view seen from a direction A shown in FIG. 1A.

Figure 2:
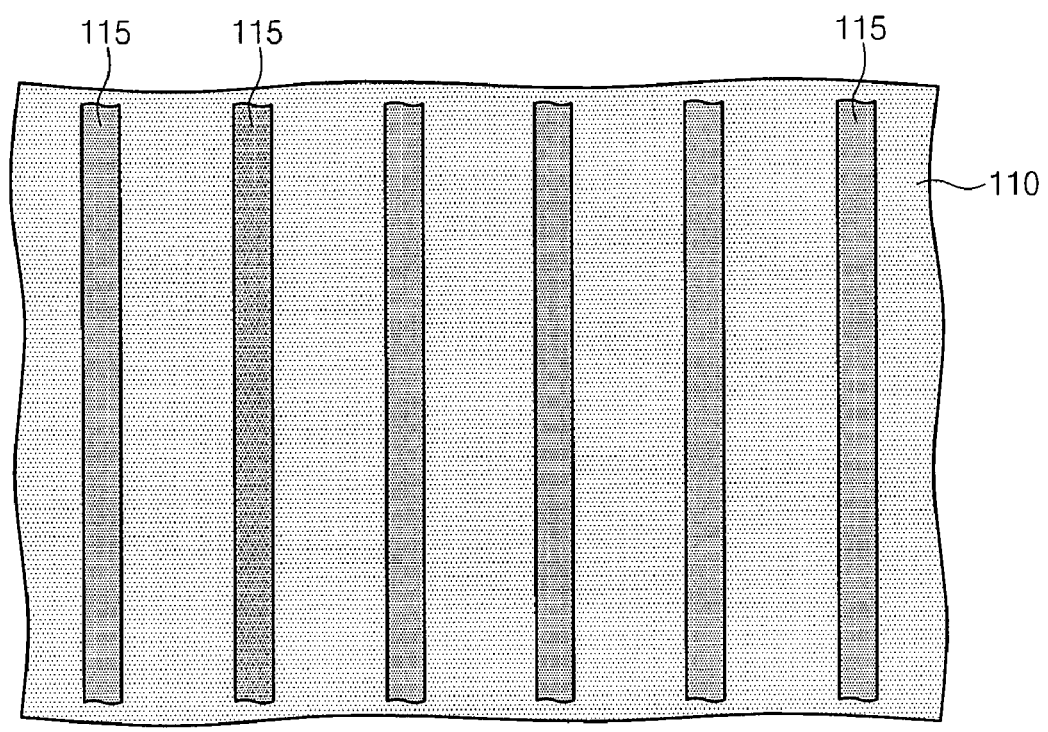
FIG. 2 is a top plan view seen from a direction A shown in FIG. 1A.

Referring to FIGS. 1A and 2, first guide patterns 115 are formed on an etching target layer 110 of a semiconductor (integrated circuit) substrate 100. A first guide layer may be formed on the etching target layer 110 and the first guide patterns 115 may be formed by patterning the first guide layer. The process of patterning the first guide layer may include a lithography process. The first guide patterns 115 may extend in one common direction to be parallel with each other as shown in FIG. 2. The first guide patterns 115 are spaced apart from each other. The first guide patterns 115 may be formed to have the same interval from each other. In some embodiments, at least portions of the first guide patterns 115 may be formed to have a different interval from each other (i.e., variations in spacing therebetween).

The etching target layer 110 may be formed of conductive material. In some embodiments, the etching target layer 110 may be formed of a hard mask layer that includes a material having an etching selectivity with respect to the substrate 100. When the etching target layer 110 is formed of the hard mask layer, the etching target layer 110 may include an oxide layer and/or a nitride layer that are sequentially stacked. The first guide patterns 115 may be formed of a material having an etching selectivity with respect to the etching target layer 110.

Figure 1B:
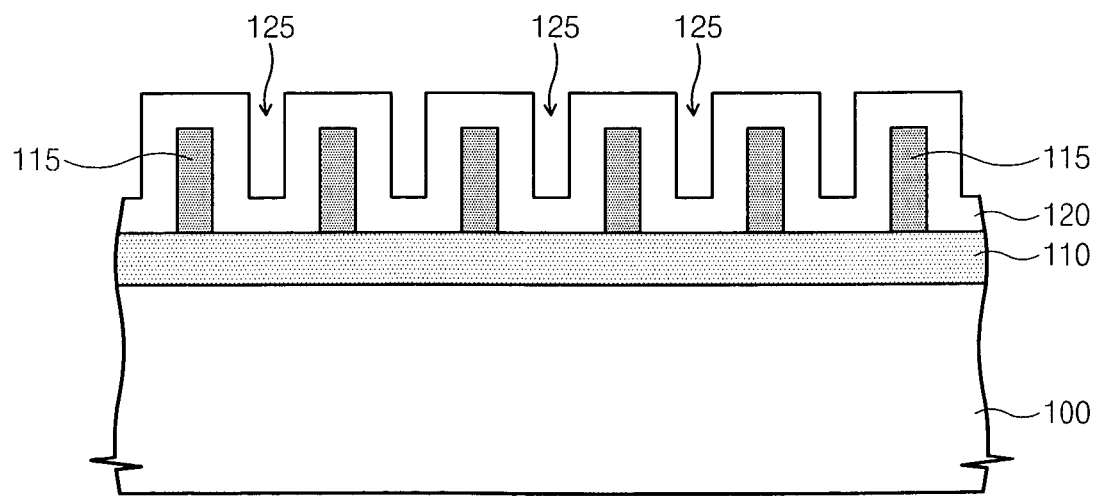

Referring to FIG. 1B, a mask layer 120 is shown conformally formed on an entire surface of the substrate 100 including the first guide patterns 115. The mask layer 120 is shown formed to have a substantially uniform thickness (conformally) along a sidewall and a top surface of the first guide pattern 115 and along a surface of the etching target layer 110 between the first guide patterns 115. Thus, an empty region 125 is formed between the adjacent first guide patterns 115. That is, the empty region 125 is formed at both sides of the first guide patterns 115. A sidewall and a bottom surface of the empty region 125 are formed of the mask layer 120. That is, the empty region 125 is surrounded by the mask layer 120 and a top portion of the empty region 125 is opened. The empty region 125 may be formed to have a groove shape that extends in parallel with the first guide patterns 115.

The mask layer 120 may be formed by a chemical vapor deposition (CVD) process and/or an atomic layer deposition (ALD) process. In some embodiments, the mask layer 120 is beneficially formed by an atomic layer deposition (ALD) process that forms the mask layer 120 on the sidewall of the first guide patterns 115 with a sufficient and substantially uniform thickness.

The mask layer 120 may be formed of material having an etching selectivity with respect to the first guide patterns 115. Also, the mask layer 120 may be formed of material having an etching selectivity with respect to the etching target layer 110.

Figure 1C:
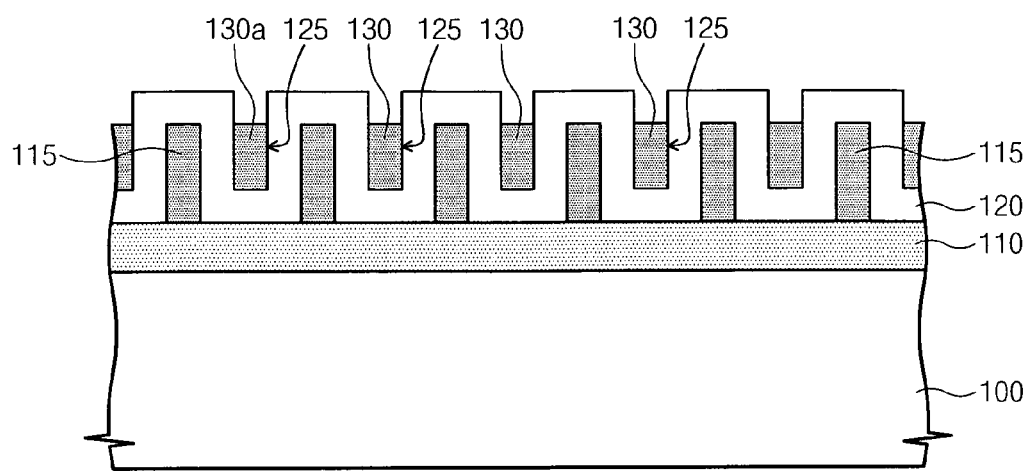

Referring to FIG. 1C, second guide patterns 130 and 130a are formed in the empty region 125, respectively. A method of forming the second guide patterns 130 and 130a will now be described. First, a second guide layer is formed on an entire surface of the substrate 100 to fill the empty regions 125. Subsequently, the second guide layer is planarized down to the top surface of the mask layer 120. Accordingly, the second guide patterns 130 and 130a may be formed to fill the empty regions 125, respectively. After the second guide layer is planarized, top surfaces of the second guide patterns 130 and 130a may be recessed to have the substantially same height as top surfaces of the first guide patterns 115. FIG. 1C is a cross sectional view illustrating the recessed second guide patterns 130 and 130a. The planarization process of the second guide layer and the recessed process may be sequentially performed by wet etching. In some embodiments, the planarization process of the second guide layer is performed by a chemical mechanical polishing (CMP) process and/or an etch-back process, and the process to recess the second guide layer may be performed using wet etching. In further embodiments, the planarization process of the second guide layer and the recessing process may be sequentially performed using an etch-back process.

The second guide patterns 130 and 130a may be formed of a material having an etching selectivity with respect to the mask layer 120. That is, the mask layer may be formed of material having an etching selectivity with respect to the first and second guide patterns 115, 130 and 130a, and with respect to the etching target layer 110. The second guide patterns 130 and 130a may have an etching selectivity with respect to the etching target layer 110. The first and second guide patterns 115, 130 and 130a may be formed of the same material.

For instance, the first and second guide patterns 115, 130 and 130a may be formed of polysilicon and the mask layer 120 may be formed of an oxide layer. In some embodiments, the first and second guide patterns 115, 130 and 130a may be formed of an oxide layer and the mask layer 120 may be formed of polysilicon.

Figure 1D:
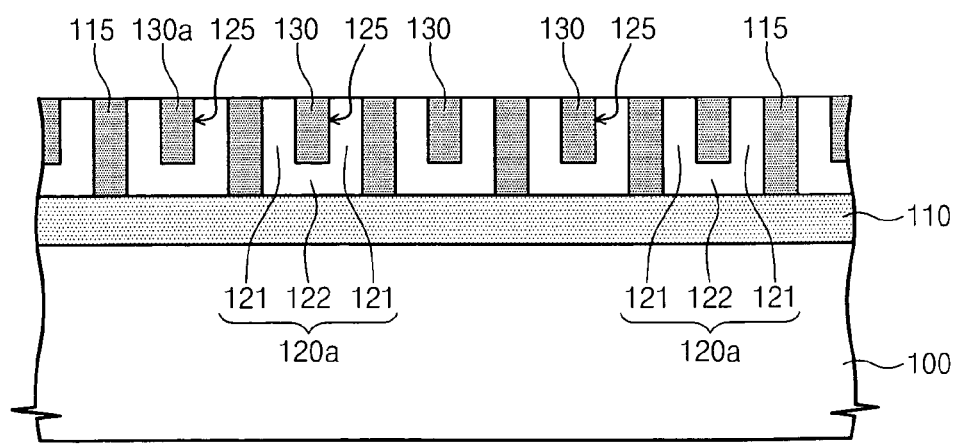

Referring to FIG. 1D, the mask layer 120 is planarized down to the top surface of the first guide patterns 115 to form preliminary mask patterns 120a. Each of the preliminary mask patterns 120a is formed between the adjacent first guide patterns 115. Each of the preliminary mask pattern 120a includes the empty region 125. Each of the preliminary mask pattern 120a includes a wall portion 121 disposed between the adjacent first guide patterns 115 and the second guide patterns 130 and 130a, and a base portion 122 disposed under the second guide patterns 130 and 130a. A top surface of the wall portion 121 in the illustrated embodiments is higher than that of the base portion 122. The top surfaces of the first and second guide patterns 115, 130 and 130a are exposed by the formation of the preliminary mask patterns 120a.

Figure 1E:
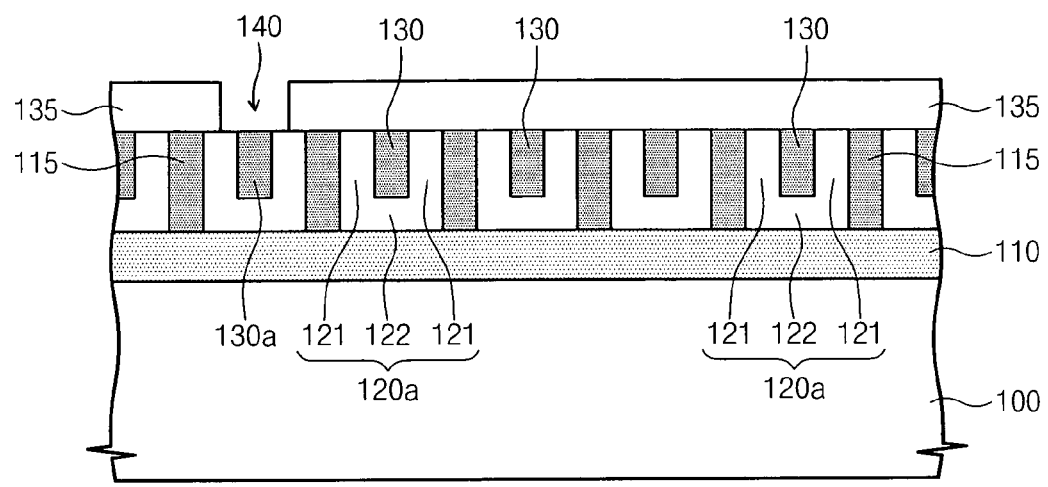

Referring to FIG. 1E, a photoresist pattern 135 is formed on an entire surface of the substrate 100. The photoresist pattern 135 includes an opening 140. The opening 140 exposes only the selected guide pattern 130a of the first and second guide patterns 115, 130 and 130a. A semiconductor pattern having a large line width will be formed under the selected guide pattern 130a by a subsequent process as described for illustrative purposes herein. As described above, the reference numeral 130a designates a selected one of the second guide patterns 130 and 130a for this purpose. In the illustrated embodiments, the selected guide pattern 130a may be one of the second guide patterns 130 and 130a. However, the selected guide pattern may be one of the first guide patterns 115. In addition, in some embodiments, a plurality of selected guide patterns for larger width features may be provided on the substrate 100. The number of the selected guide patterns may be two or more selected from the first guide patterns 115 and/or the second guide patterns 130 and 130a.

Figure 1F:
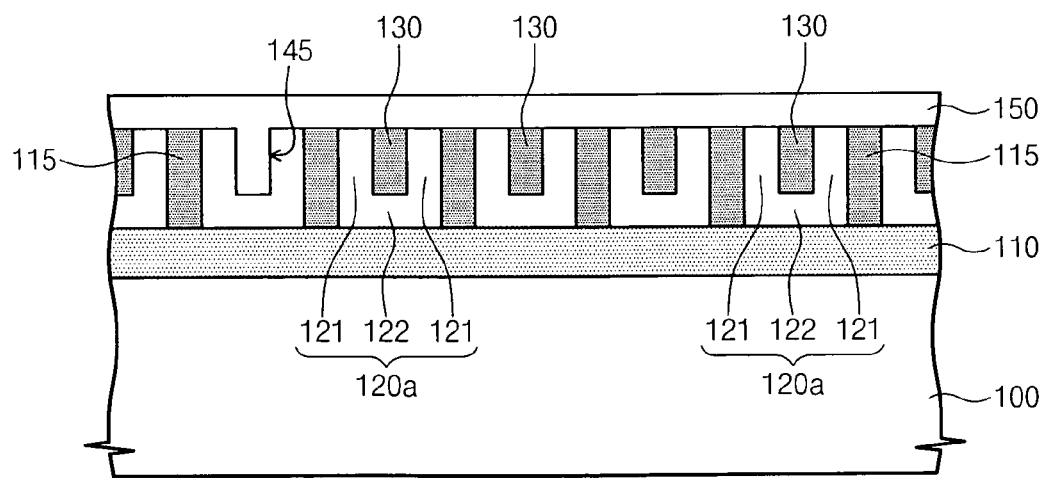

Referring to FIG. 1F, the selected guide pattern 130a exposed by the opening 140 is removed to form a gap region 145. The gap region 145 is a region where the selected guide pattern 130a is removed. Non-selected ones of the first and second guide patterns 115 and 130 remain after the selected guide pattern 130a is removed. The non-selected guide patterns 115 and 130 in some embodiments include at least one the first guide patterns 115 and one of the second guide patterns 130 adjacent to each other. Thus, after the gap region 145 is formed, both sidewalls of at least one of the wall portions 121 are surrounded by the first guide pattern 115 and the second guide pattern 130. In the case that the selected guide pattern 130a is one of the second guide patterns 130 and 130a, the gap region 145 may correspond to the empty region 125. When the selected guide pattern is one of the first guide patterns 115, the gap region 145 is disposed between a pair of preliminary mask patterns 120a adjacent to each other.

Subsequently, the photoresist pattern 135 is removed. A filling mask layer (pattern) 150 is formed on the substrate 100 to fill the gap region 145. The filling mask layer 150 may be formed of a material having an etching selectivity with respect to the first and second guide patterns 115 and 130. Also, the filling mask layer 150 may be formed of material having an etching selectivity with respect to the etching target layer 110. The filling mask layer 150 may be formed of the same material as the mask layer 120.

Figure 1G:
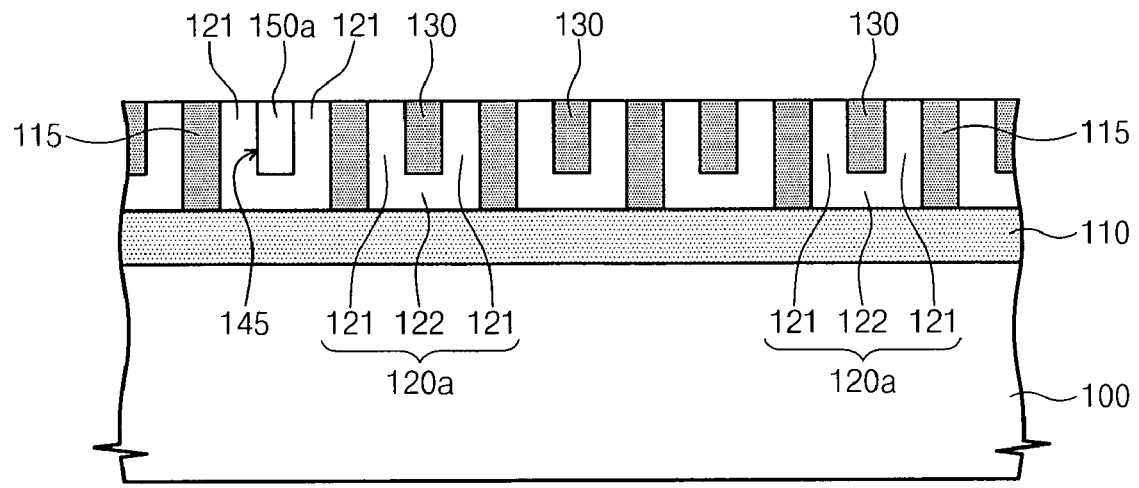

Referring to FIG. 1G, the filling mask layer 150 is planarized down to the top surfaces of the first and second guide patterns 115 and 130 to form a filling mask pattern 150a in the gap region 145. The filling mask pattern 150a is in contact with a pair of the wall portions 121 that correspond to the both sidewalls of the gap region 145.

Figure 1H:
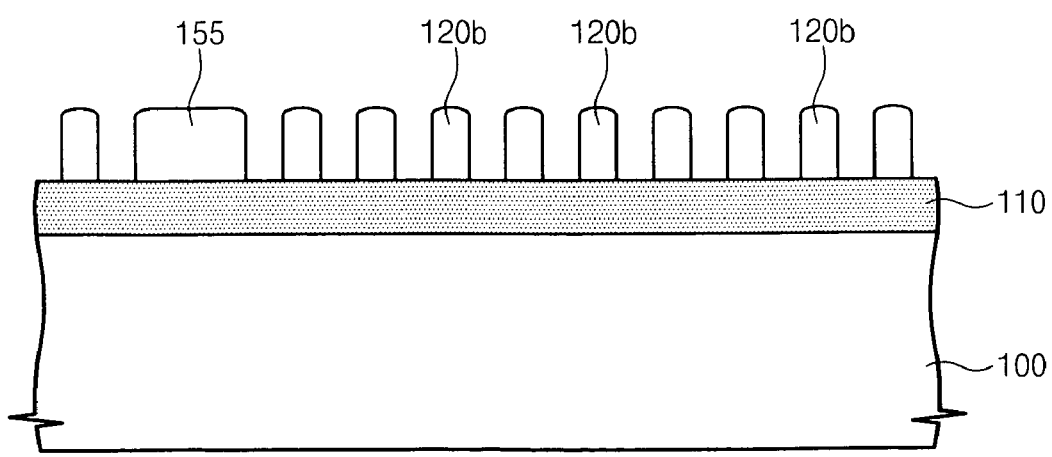

Referring to FIG. 1H, the first and second guide patterns 115 and 130 are removed. The preliminary mask pattern 120a and the filling mask pattern 150a remain on the substrate 100. Also, the base portion 122 disposed under the second guide patterns 130 is exposed. As shown in FIG. 1H, the base portion covered with the filling mask pattern 150a is not exposed. That is, the base portions 122 disposed under the non-selected second guide patterns 130 are exposed.

Subsequently, the exposed base portions 122 are anisotropically etched to expose the etching target layer 110 under the exposed base portion 122. Mask patterns 120b and 155 are formed on the etching target layer 110 by removing the exposed base portions. When the exposed base portions 122 are etched, the wall portion 121 is also anisotropically etched. However, as the wall portion 121 is formed to be higher than the base portion 122, the wall potions 121 remain on the etching target layer 110. When the filling mask pattern 150a is formed of the same material as the preliminary mask layer 120a, the filling mask pattern 150a may also be anisotropically etched. In FIG. 1H, the filling mask pattern 150a is formed of the same material as the mask layer 120.

The mask patterns 120b and 155 include first mask patterns 120b and a second mask pattern 155. The second mask pattern 155 includes the anisotropically etched filling mask pattern and a pair of the anisotropically etched wall portions which are in contact with the both sides of the anisotropically etched filling mask pattern, respectively. The first mask patterns 120b correspond to the anisotropically etched wall portions being spaced apart from the second mask pattern 155, respectively. Thus, a line width of the second mask pattern 155 is larger than that of the first mask pattern 120b.

Figure 1I:
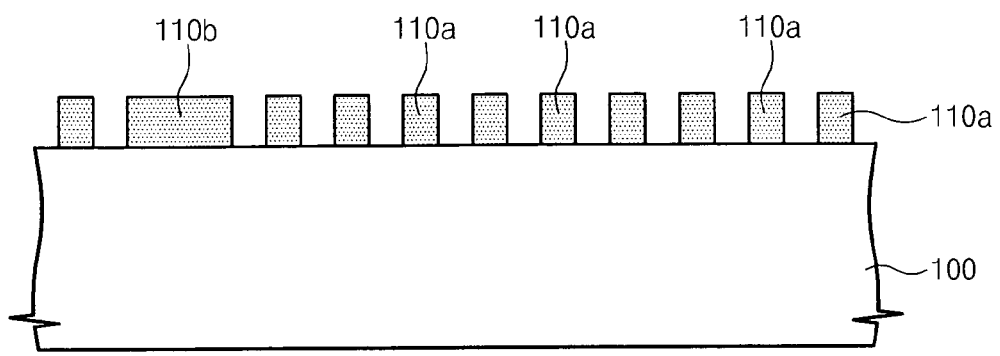

Referring to FIG. 1I, the etching target layer 110 is etched using the first and second mask patterns 120b and 155 as an etching mask to form first and second real semiconductor patterns 110a and 110b. The first real semiconductor pattern 110a is formed under the first mask pattern 120b and the second real semiconductor pattern 110b is formed under the second mask pattern 155. The first and second mask patterns 120b and 155 are then removed.

The first real semiconductor pattern 110a is defined by the first mask pattern 120b. The first mask pattern 120b includes the wall portion 121 of the preliminary mask pattern 120a. Thus, a line width of the first mask pattern 120b is determined by a width of the wall portion 121. The width of the wall portion 121 is determined by a thickness of the mask layer 120. Therefore, the line width of the first mask pattern 120b need not depend on the limits of the lithography process. That is, a distribution of the line width generated by the lithography process may not affect the line width consistency of the first mask patterns 120b. A uniformity of the line width of the first mask pattern 120b may, thus, be improved. Particularly, in the case of forming the mask layer 120 by means of an atomic layer deposition (ALD) process, the uniformity of the line width of the first mask pattern 120b may be significantly improved.

Also, the second mask pattern 155 having a relatively large width as well as the first mask pattern 120b having a fine line width may be formed by the filling mask pattern 150a. As a result, the first real semiconductor patterns 110a having a fine line width and the second real semiconductor patterns 110b having a relatively large width may be formed simultaneously.

The etching target layer 110 may be formed of conductive material. In this case, the first and second real semiconductor patterns 110a and 110b may be used as an interconnection line, such as a bit line or a word line, of a memory device (such as a direct random access memory (DRAM) device, a phase changeable memory device, and/or a flash memory device, etc). In this case, a single layered or a multi layered insulating layer may be disposed between the etching target layer 110 and the substrate 100.

In some embodiments, when the etching target layer 110 is formed of a hard mask, the first and second real semiconductor patterns 110a and 110b may be formed of hard mask patterns defining an active region. A method of forming a semiconductor device for such embodiments will be further described referring to FIG. 1J.

Figure 1J:
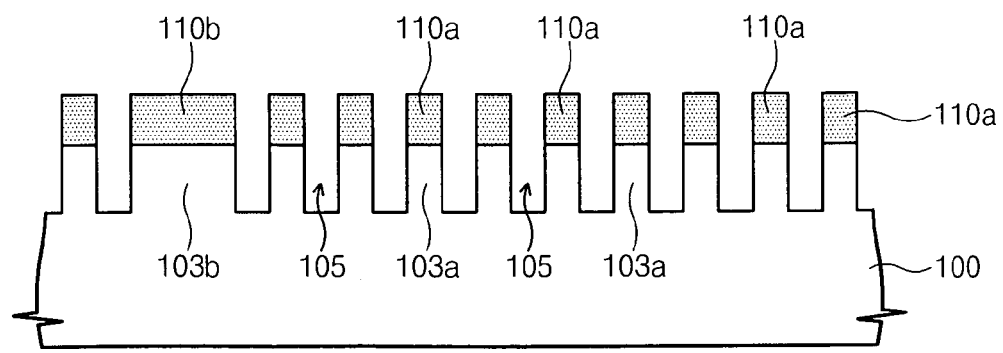

Referring to FIG. 1J, the substrate 100 is etched using the first and second real semiconductor patterns 110a and 110b as an etching mask to form a trench 105 defining the active regions 103a and 103b. The trench 105 may extend in one direction. The trench 105 may have a groove shape. Also, the active regions 103a and 103b may extend in one direction, and the active regions 103a and 103b may have a line shape. The first active regions 103a having a small width are defined under the first real semiconductor pattern 110a and the second active region 103b having a relatively large width is defined under the second real semiconductor pattern 110b. A device isolation layer may be formed to fill the trench 105.

Further embodiments of the present invention will now be described. More particularly, FIGS. 3A through 3G are cross sectional views illustrating a method of forming a semiconductor device in accordance with further embodiments of the present invention, FIG. 4 is a top plan view seen a direction B seen in FIG. 3A, and FIG. 5 is a top plan view seen from a direction C seen in FIG. 3G.

Figure 3A:
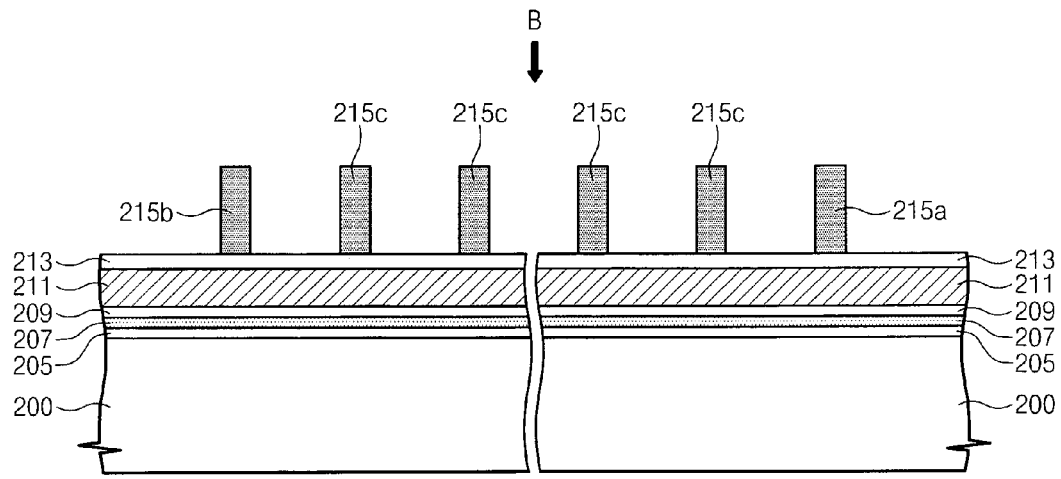
FIGS. 3A through 3G are cross sectional views illustrating a method of forming a semiconductor device in accordance with further embodiments of the present invention.
Figure 4:
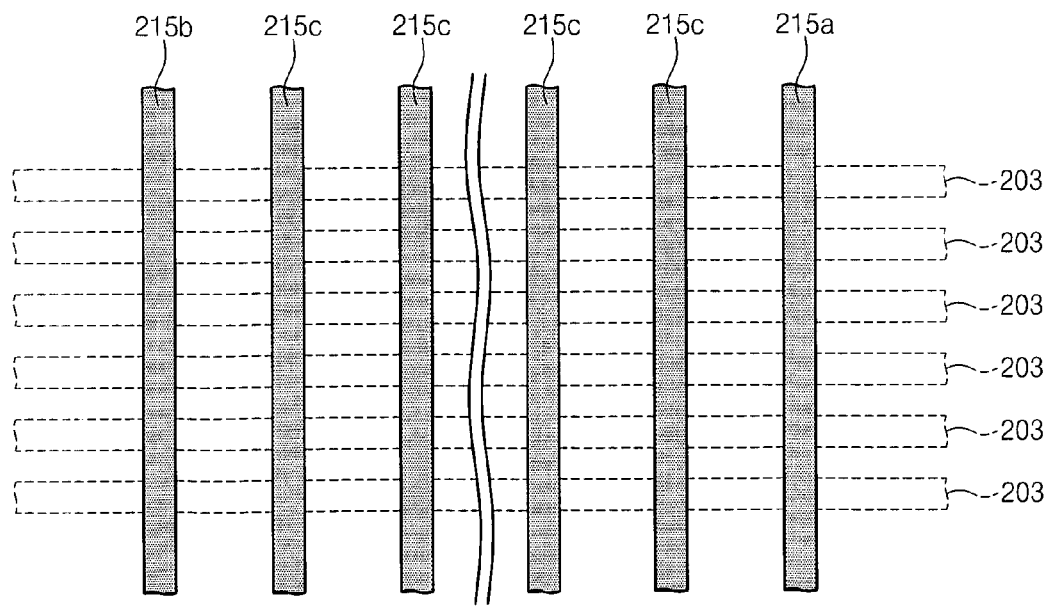
FIG. 4 is a top plan view seen from a direction B shown in FIG. 3A.
Figure 5:
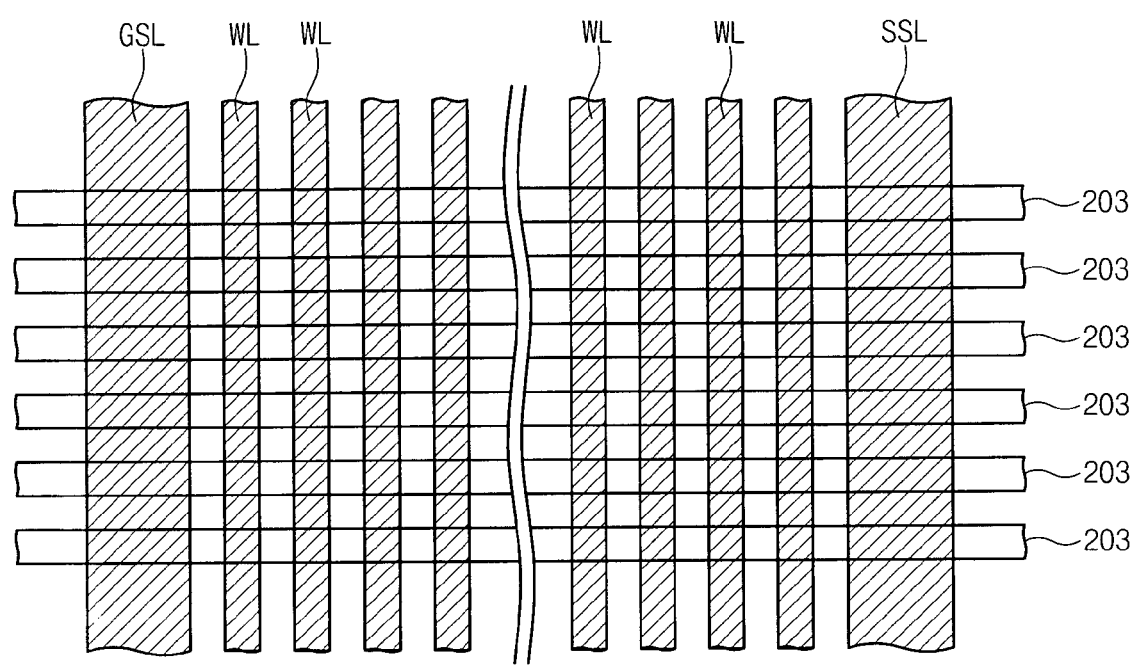
FIG. 5 is a top plan view seen from a direction C shown in FIG. 3G.

Referring to FIGS. 3A and 4, a device isolation layer is formed in a substrate 200 to define active regions 203 that are parallel with each other. The active regions 203 may be line shaped parallel regions as seen in plan view in FIG. 4. The active regions 203 may be formed using the same method as the first and second active regions 103a and 103b of the above described embodiments. In this case, an active region having a width larger than the active region 203 may also be formed in the substrate 200.

A tunnel insulating layer 205 and a charge storage layer 207 that are sequentially stacked are formed on the active region 203. The tunnel insulating layer 205 may be formed of an oxide layer, such as a thermal oxide layer. The charge storage layer 207 may be formed of undoped polysilicon and/or doped polysilicon. In some embodiments, the charge storage layer 207 is formed on a limited portion of the active region 203.

In other embodiments, the charge storage layer 207 may be formed of an insulating material having a deep level trap. For example, the charge storage layer 207 may be formed of a silicon nitride layer and/or an insulating layer including a number of nanocrystals. The charge storage layer 207 may be formed on an entire surface of the substrate 200. In some embodiments where the charge storage layer 207 is formed of insulating material having a trap of a deep level, the charge storage layer 207 may be formed only on a limited portion of the active region 203.

A blocking insulating layer 209 is formed on an entire surface of the substrate 200 including the charge storage layer 207. The blocking insulating layer 209 may be formed of an oxide layer and/or an oxide-nitride-oxide (ONO) layer. When the blocking insulating layer 209 is formed of an oxide layer, the blocking insulating layer 209 may be formed to have a thickness greater than the tunnel insulating layer 205. The blocking insulating layer 209 may include a high dielectric material having a high dielectric constant as compared with the tunnel insulating layer 205. For instance, the blocking insulating layer 209 may include an insulating metal oxide, such as hafnium oxide and/or aluminum oxide.

A control gate conductive layer 211 is formed on an entire surface of the substrate 200 including the blocking insulating layer 209. The control gate conductive layer 211 may include a doped polysilicon, a metal (ex: tungsten or molybdenum, etc), a conductive metal nitride (ex: nitride titanium, nitride tantalum, or nitride tungsten, etc) and/or a metal silicide (ex: tungsten silicide or cobalt silicide, etc).

A capping layer 213 may be formed on the control gate conductive layer 211. The capping layer 213 may be formed of various materials, such as an oxide layer, a polysilicon layer or an oxide nitride layer, and/or the like. In another embodiment, the capping layer 213 may not be formed.

First guide patterns 215a, 215b, and 215c are formed on the capping layer 213 to be parallel to each other. The first guide patterns 215a, 215b, and 215c may have a line shape and cross the active region 203. The illustrated first guide patterns 215a, 215b, and 215c include a string selection guide pattern 215a, a ground selection guide pattern 215b, and a plurality of cell guide patterns 215c disposed between the string and ground selection guide patterns 215a and 215b. The first guide patterns 215a, 215b, and 215c may be formed to have substantially the same interval from each other. The interval between the first guide patterns 215a, 215b and 215c may be larger than 1F (here, 1F means a minimum feature size). For instance, the interval between the first guide patterns 215a, 215b and 215c may be 4F.

In some embodiments, the cell guide patterns 215c have substantially the same line width with respect to each other. The string selection guide pattern 215a may have substantially the same line width as the ground selection guide pattern 215b. The string and ground selection guide patterns 215a and 215b may have the same line width as the cell guide pattern 215c or have a different line width from that of the cell guide pattern 215c.

Figure 3B:
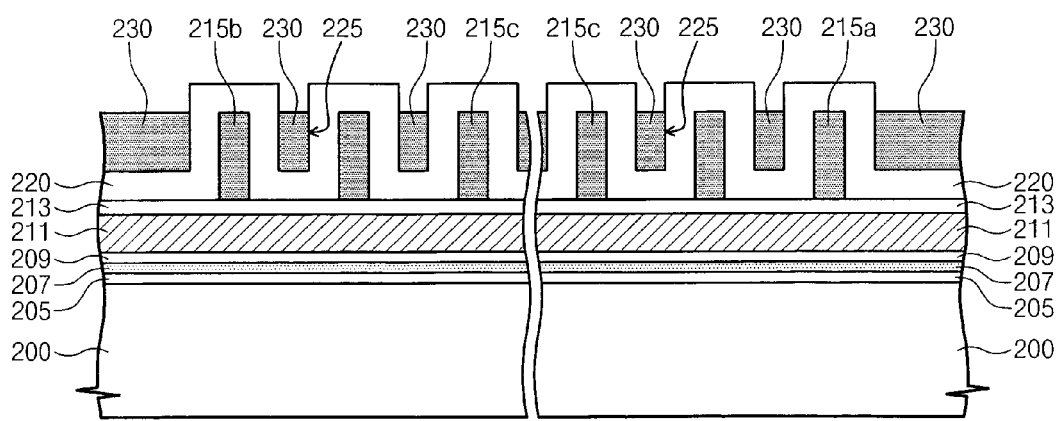

Referring to FIG. 3B, a mask layer 220 is conformally formed on an entire surface of the substrate 200 including the first guide patterns 215a, 215b and 215c. The mask layer 220 may be formed of a material having an etching selectivity with respect to the first guide patterns 215a, 215b and 215c, and the control gate conductive layer 211. The mask layer 220 may be formed by a chemical vapor deposition (CVD) process and/or an atomic layer deposition (ALD) process. In some embodiments, the mask layer 220 is formed by an atomic layer deposition (ALD) process.

Empty regions 225 are formed between the first guide patterns 215a, 215b and 215c by conformally forming the mask layer 220. The string selection guide pattern 215a includes a first side and a second side opposite to each other. The first cell guide patterns 215c are disposed at the first side of the string selection guide pattern 215a. The empty region 225 is also disposed at the second side of the string guide pattern 215a. The ground selection guide pattern 215b includes a first side and a second side opposite to each other. The cell guide patterns 215c are disposed at the first side of the ground selection guide pattern 215b. The empty region 225 is also disposed at the second side of the ground guide pattern 215b. The empty regions 225 formed at the second sides of the string and ground selection guide patterns 215a and 215b may have a width larger than the empty regions 225 formed between the first guide patterns 215a, 215b and 215c.

Second guide patterns 230 are formed to fill the empty regions 225, respectively. The second guide patterns 230 are formed of a material having an etching selectivity with respect to the mask layer 220. The second guide patterns 230 may be formed of the same material as the first guide patterns 115. For instance, the mask layer 220 may be formed of oxide and the first and second guide patterns 215a, 215b and 215c may be formed of polysilicon. In some embodiments, the mask layer 220 may be formed of polysilicon and the first and second guide patterns 215a, 215b and 215c may be formed of oxide. The method used in forming the second guide patterns 230 may be substantially the same method as described with reference to the second guide pattern 130 of FIG. 1C.

Figure 3C:
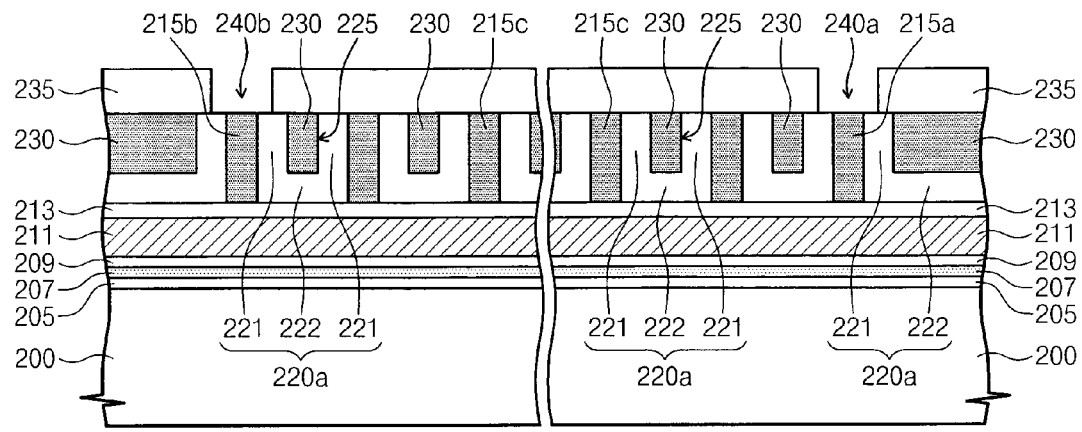

Referring to FIG. 3C, the mask layer 220 is planarized down to the top surface of the first guide patterns 215a, 215b and 215c to form preliminary mask patterns 220a. The preliminary mask pattern 220a includes a wall portion 221 disposed between first guide patterns 215a, 215b and 215c and the second guide patterns 230 adjacent to each other, and includes a base portion 222 disposed under the second guide pattern 230. A top surface of the wall portion 221 is higher than that of the base portion 222. The preliminary mask patterns 220a are also formed on the second side of the string and ground selection guide patterns 215a and 215b.

A photoresist pattern 235 including first and second openings 240a and 240b is formed on an entire surface of the substrate 200. The first opening 240a exposes the string selection guide pattern 215a and the second opening 240b exposes the ground selection guide pattern 215b.

Figure 3D:
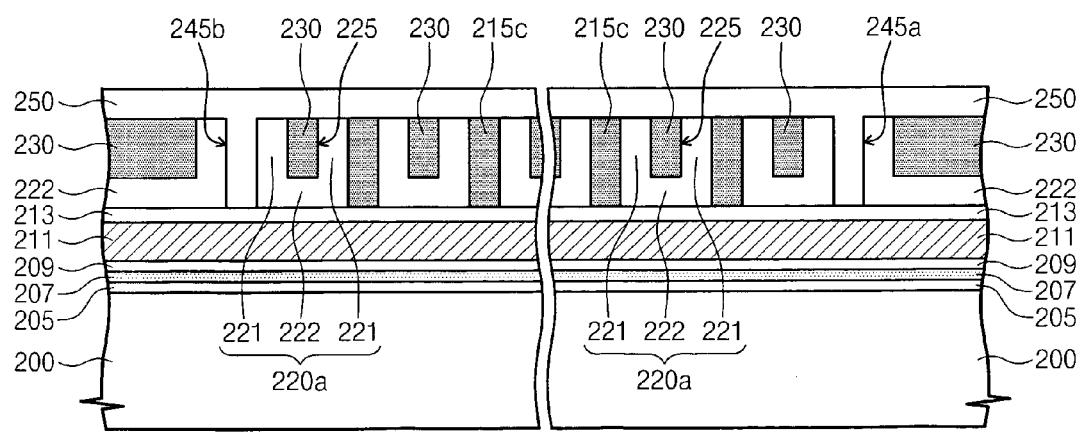

Referring to FIG. 3D, the exposed string and ground selection guide patterns 215a and 215b are removed to form first and second gap regions 245a and 245b, respectively. The first gap region 245a is a region where the string selection guide pattern 215a is removed and the second gap region 245b is a region where the ground selection guide pattern 215b is removed.

The photoresist pattern 235 is removed and a filling mask layer 250 is formed on an entire surface of the substrate 200 to fill the first and second gap regions 245a and 245b. The filling mask layer 250 is formed of material having an etching selectivity with respect to the cell guide patterns 215c, the second guide patterns 230 and the control gate conductive layer 211. The filling mask layer 250 may be formed of the same material as the mask layer 220.

Figure 3E:
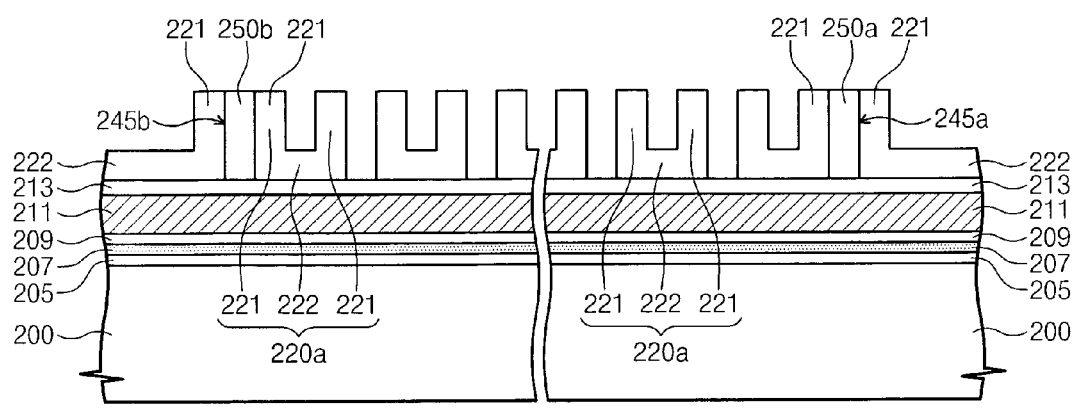

Referring to FIG. 3E, the filling mask layer 250 is planarized down to the top surfaces of the cell guide patterns 230 and the second guide pattern 230 to form first and second filling mask patterns 250a and 250b filling the first and second gap regions 245a and 245b, respectively.

The cell guide patterns 215c and the second guide patterns 230 are removed. As a result, the base portions 222 disposed under the second guide patterns 230 are exposed. The first and second filling mask patterns 250a and 250b and the preliminary mask patterns 220a remain.

Figure 3F:
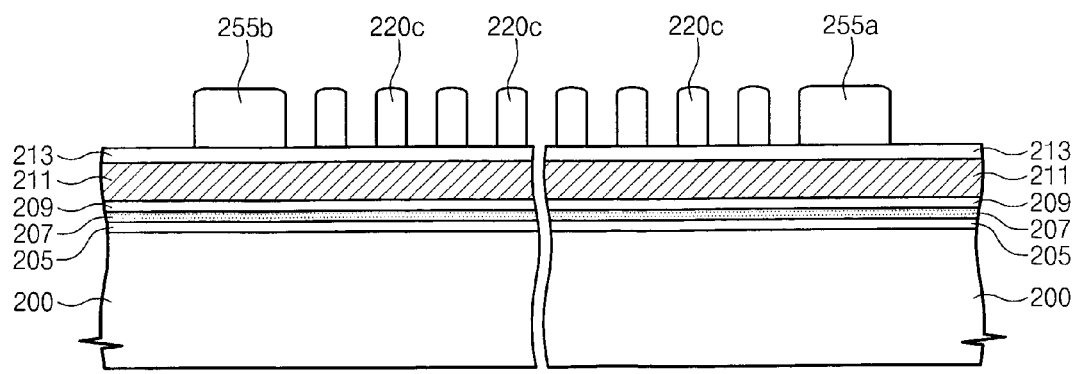

Referring to FIG. 3F, the exposed base portions 222 are anisotropically etched to form mask patterns 220c, 255a and 255b. As the base portion 222 and the wall portion 221 are a portion of the mask layer 220, the top portion of the wall portion 221 may also be etched during the etching of the base portion 222. The mask patterns 220c, 255a and 255b include cell mask patterns 220c, a string selection mask pattern 255a and a ground selection mask pattern 255b. The mask patterns include an anisotropically etched wall portion. The string selection mask pattern 255a includes the anisotropically etched first filling mask pattern 250a and the pair of anisotropically etched wall portion which is in contact with the both sides of the anisotropically etched first filling mask pattern 250a. The ground selection mask pattern 255b includes the anisotropically etched second filling mask pattern 250b and the pair of anisotropically etched wall portion which is in contact with the both sides of the anisotropically etched second filling mask pattern 250b. Due to the first and second filling mask patterns 250a and 250b, the string and ground selection mask patterns 255a and 255b have a width larger than the cell mask patterns 220c.

The cell mask patterns 220c include the wall portions 221 that remain between the string and ground selection mask patterns 255a and 255b, respectively. The wall portions 221 included in the cell mask patterns are shown spaced apart from the string and ground selection mask patterns 255a and 255b. A line width of the cell mask pattern 220c is determined by a line width of the wall portion 221. The line width of the wall portion 221 is determined by a thickness of the mask layer 220. Thus, a distribution of the line width generated by a lithography process is not limiting for the cell mask patterns 220c. The line widths of the cell mask patterns 220c can be provided an excellent uniformity in some embodiments as a result. When the cell mask layer 220 is formed by an atomic layer deposition (ALD) process, the uniformity of the line width of the cell mask patterns 220c may be greatly improved. Also, the string and ground selection mask patterns 255a and 255b may be formed to have a larger width by the first and second filling mask patterns 250a and 250b.

Figure 3G:
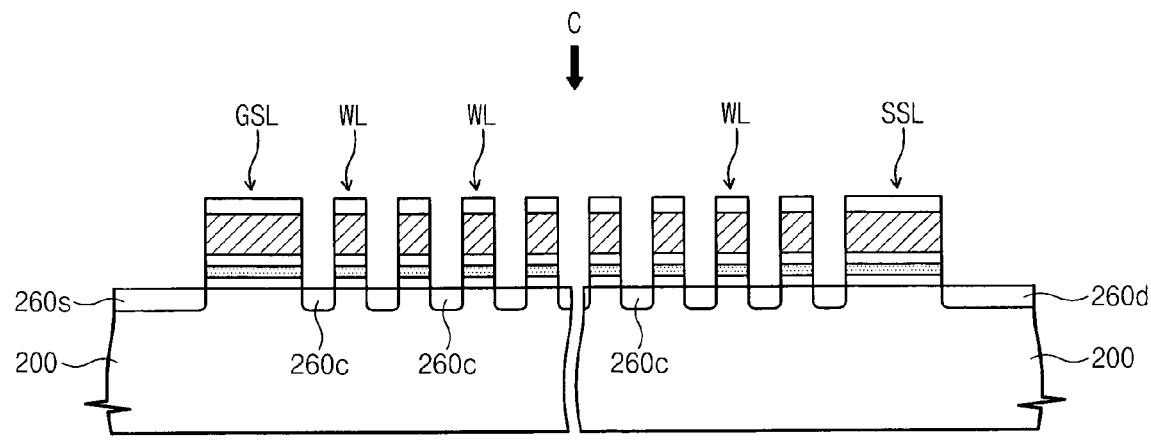

Referring to FIGS. 3G and 5, when the charge storage layer 207 is formed of polysilicon, the capping layer 213, control gate conductive layer 211, blocking insulating layer 209 and charge storage layer 207 may be sequentially etched, using the string selection, cell and ground selection mask patterns 255a, 220c and 255b as an etching mask, to form a string selection line (SSL), word lines (WL) and a ground selection line (GSL). The string selection line (SSL), word lines (WL) and the ground selection line (GSL) are formed under the string selection mask pattern 255a, the cell mask pattern 220c and the ground selection mask pattern 255b, respectively. When forming the control gate conductive layer 211, holes may be formed to penetrate the blocking insulating layer 209 where the string and ground selection lines (SSL) and (GSL) are formed. Thus, a specific portion of the control gate conductive layer 211 and the charge storage layer 207 under the string selection line (SSL) may be connected to each other through the holes. Also, the specific portion of the control gate conductive layer 211 and the charge storage layer 207 under the ground selection line (GSL) may be connected to each other through the holes.

In further embodiments, when the charge storage layer 207 is formed of insulating material including deep level traps, the capping layer 213 and the control gate conductive layer 211 may be sequentially etched, using the string selection, cell and ground selection mask patterns 255a, 220c and 255b as an etching mask, to form the string selection line (SSL), the word lines (WL) and the ground selection line (GSL). The blocking insulating layer 209 may be used as an etching stop layer during the etching process. Charges stored in the deep level traps may not move to other cells. Accordingly, memory cell interference may be limited or even prevented. As a result, the charge storage layer 207 may not be divided. In some embodiments, when the charge storage layer 207 is formed of an insulating material including deep level traps, the capping layer 213, the control gate conductive layer 211, the blocking insulating layer 209 and the charge storage layer 207 may be successively etched using the mask patterns 255a, 220c and 255b as an etching mask. At this time, the tunnel insulating layer 205 may be used as an etching stop layer during the etching process.

The mask patterns 255a, 220c and 255b may be removed after the string selection line (SSL), the word lines (WL) and the ground selection line (GSL) are formed.

Using the string selection line (SSL), the word lines (WL) and the ground selection line (GSL) as a mask, a dopant ion implantation process may be performed in the active region 203 to form a common drain region 260d, cell source/drain regions 260c and a common source region 260s. The common drain region 260d is formed in the active region 203 of one side of the string selection line (SSL). The common source region 260s is formed in the active region 203 of one side of the string selection line (GSL). The cell source/drain regions 260c are formed in the active region 203 on both sides of the word line (WL). The common drain region 260d may be formed under the second guide pattern 230, which is disposed at the second side of the string selection guide pattern 215a. The common source region 260s may be formed under the second guide pattern 230, which is disposed at the second side of the ground selection guide pattern 215b.

A word line (WL) most adjacent to the string selection line (SSL) and a word line (WL) most adjacent to the ground selection line (GSL) may be used as a dummy line. Thus, a first space between the string selection line (SSL) and an actually operating word line (WL) most adjacent to the string selection line (SSL) and a second space between the ground selection line (GSL) and an actually operating word line (WL) most adjacent to the ground selection line (GSL) may increase. The first and second spaces may be formed to have the same dimension and a characteristic of a NAND-type nonvolatile memory device may be improved by increasing the first and second spaces.

According to methods of forming the semiconductor device described above, the line width of the cell mask pattern 220c defining the word line (WL) is determined by the thickness of the mask layer 220. Thus, the problems resulting from reliance on a conventional lithography process may be limited or even prevented. Also, using the filling mask patterns 250a and 250b, the string and ground selection mask patterns 255a and 255b having a relatively large width may be formed.

In addition, the number of the wall portions 221 disposed between the string and ground selection guide patterns 215a and 215b may be an even number. Accordingly, the number of the cell mask patterns 220c disposed between the string and ground selection mask patterns 255a and 255b may be even number. An even number of word lines may be required for the cell string of the flash memory device. Thus, additional processes may not be required for forming the even number of word lines. As a result, the manufacturing process may be simplified.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a semiconductor device, comprising:
    forming a mask layer on a semiconductor substrate, the mask layer having vertically extending portions and horizontally extending portions, the vertically extending portions having a thickness selected to provide a desired line width to an underlying structure to be formed using the mask layer and a height greater than a height of the horizontally extending portions; and
    forming the underlying structure using the mask layer, wherein forming the underlying structure comprises forming mask patterns, wherein the semiconductor device comprises a memory device and wherein forming the underlying structure further comprises forming word lines using the mask patterns, wherein forming the mask patterns includes concurrently forming a string selection mask pattern, a ground selection mask pattern and a plurality of cell mask patterns extending between the string selection mask pattern and the ground selection mask pattern, the string selection mask pattern and the ground selection mask pattern having a line width greater than a line width of the cell mask patterns and wherein forming the word lines comprises forming the word lines using the cell mask patterns and wherein forming the underlying structure further comprises forming a string selection line using the string selection mask pattern and forming a ground selection line using the ground selection mask pattern.

2. A method of forming a semiconductor device, comprising:
    forming a plurality of first guide patterns on an etching target layer of a substrate;
    conformally forming a mask layer on the substrate in a region including the first guide patterns to define empty regions on respective sides of the first guide patterns;
    forming second guide patterns in the empty regions;
    planarizing the mask layer to expose of the first guide pattern and to define a preliminary mask pattern including wall portions between the first and second guide patterns and a base portion under the second guide pattern;
    removing the first and second guide patterns; and
    removing the base portion by anisotropic etching of the mask layer to form mask patterns.

3. The method of claim 2, wherein removing the first and second guide patterns is preceded by:
    removing a guide pattern selected from the first and second guide patterns to form a gap region; and
    forming a filling mask pattern that fills the gap region, wherein the filling mask pattern is formed of a material having an etching selectivity with respect to the first and second guide patterns.

4. The method of claim 3, wherein the mask patterns comprise a first mask pattern and a second mask pattern displaced therefrom, the first mask pattern being the anisotropically etched wall portion and the second mask pattern including the filling mask pattern and a pair of the anisotropically etched wall portions in contact with both sidewalls of the filling mask pattern.

5. The method of claim 3, wherein the filling mask pattern and the mask layer are formed of a same material.

6. The method of claim 2, wherein the first guide patterns are formed to be parallel to each other.

7. The method of claim 2, further comprising etching the etching target layer to faun actual patterns using the mask patterns as an etching mask.

8. The method of claim 7, wherein the etching target layer is formed of a conductive material.

9. The method of claim 7, wherein the etching target layer is a hard mask layer and the actual patterns correspond to hard mask patterns, the method further comprising etching the substrate using the hard mask pattern as an etching mask to form a trench defining an active region.

10. The method of claim 2, wherein the first and second guide patterns are formed of a same material.

11. A method of forming a semiconductor device, comprising:
    forming first guide patterns on a control gate conductive layer of a substrate, the first guide patterns extending parallel to each other, the first guide patterns including a string selection guide pattern, a ground selection guide pattern, and a plurality of cell guide patterns between the string and ground selection guide patterns;

conformally forming a mask layer on the substrate in a region including the first guide patterns to define empty regions on respective sides of the first guide patterns;

forming second guide patterns in the empty regions;

planarizing the mask layer down to a top surface of the first guide pattern to form preliminary mask patterns, each of the preliminary mask patterns including a wall portion between the first and second guide patterns and a base portion under the second guide pattern;

removing the string and ground selection guide patterns to form respective first and second gap regions;

forming first and second filling mask patterns that fill the respective first and second gap regions;

removing the first and second guide patterns; and removing the base portion by anisotropic etching to form mask patterns, wherein the mask layer and the first and second filling mask patterns are formed of a material having an etching selectivity with respect to the first and second guide patterns.

12. The method of claim 11, wherein:

the mask pattern comprises a string selection mask pattern, cell mask patterns and a ground selection mask pattern;

the string selection mask pattern comprises the first filling mask pattern and the anisotropically etched wall portions in contact with both sides of the first filling mask pattern;

the ground selection mask pattern comprises the second filling mask pattern and the anisotropically etched wall portions in contact with both sides of the second filling mask pattern; and the cell mask patterns comprise the anisotropically etched wall portions between the string selection mask pattern and the ground selection mask pattern.

13. The method of claim 11, wherein removing the base portion is followed by etching the control gate conductive layer to form a string selection line, word lines and a ground selection line using the mask patterns as an etching mask.

14. The method of claim 13, wherein etching the control gate conductive layer is followed by implanting dopant ions into the substrate using the string selection line, word lines and the ground selection line as a mask to form a common source region, cell source/drain regions and a common drain region.

15. The method of claim 13, wherein forming first guide patterns is preceded by:

forming a tunnel insulating layer on the substrate;

forming a charge storage layer on the tunnel insulating layer;

forming a blocking insulating layer on the charge storing layer, wherein the control gate conductive layer is formed on the blocking insulating layer.

16. The method of claim 15, wherein the charge storage layer is formed of an insulating material including deep level traps and wherein the string selection line, the word lines and the ground selection line are formed by etching the control gate conductive layer using the mask patterns as an etching mask.

17. The method of claim 15, wherein the charge storage layer is formed of polysilicon and wherein the string selection line, the word lines and the ground selection line are formed by successively etching the control gate conductive layer, the blocking insulating layer and the charge storage layer using the mask patterns as an etching mask.

18. The method of claim 13, wherein one of the word lines closest to the string selection line and one of the word lines closest to the ground selection line are dummy lines that are not coupled to active cells.

19. The method of claim 11, wherein the mask layer, the first filling mask pattern and second filling mask pattern are formed of a same material.

20. The method of claim 11, wherein the first and second guide patterns are formed of a same material.

21. The method of claim 11, wherein the wall portions between the string selection guide and the ground selection pattern comprise an even number of wall portions.

22. The method of claim 1, wherein forming the underlying structure comprises using the vertically extending portions as an etching mask.

* * * * *